US012763732B2

(12) United States Patent
Sundar et al.

(10) Patent No.: US 12,763,732 B2
(45) Date of Patent: Oct. 13, 2026

(54) REDUCTION OF CLICK AND POP NOISE IN AN AMPLIFIER

(71) Applicant: TEXAS INSTRUMENTS INCORPORATED, Dallas, TX (US)

(72) Inventors: Aditya Sundar, Bangalore (IN); Sumit Dubey, Bangalore (IN); Anand Kannan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 513 days.

(21) Appl. No.: 18/498,748

(22) Filed: Oct. 31, 2023

(65) Prior Publication Data

US 2025/0141408 A1 May 1, 2025

(51) Int. Cl.
*H03F 1/30* (2006.01)
*H03F 3/217* (2006.01)

(52) U.S. Cl.
CPC ........... *H03F 1/305* (2013.01); *H03F 3/2173* (2013.01); *H03F 2200/03* (2013.01); *H03F 2200/372* (2013.01); *H03F 2200/471* (2013.01); *H03F 2200/78* (2013.01)

(58) Field of Classification Search
CPC ........ H03F 1/305; H03F 3/2173; H03F 3/187; H03F 3/45475; H03F 2200/03; H03F 2200/372; H03F 2200/471; H03F 2200/78; H03F 2200/351
USPC ...................................... 330/149, 251, 207 A
See application file for complete search history.

(56) References Cited

U.S. PATENT DOCUMENTS

2012/0013402 A1* 1/2012 Song ...................... H03F 3/217 330/207 A

* cited by examiner

*Primary Examiner* — Andrea Lindgren Baltzell
*Assistant Examiner* — Nareh Shamiryan
(74) *Attorney, Agent, or Firm* — Xianghui Huang; Frank D. Cimino

(57) ABSTRACT

In an example, a system includes a loop filter including one or more integrators. The system includes a ramp generator. The system includes a comparator having a first input coupled to an output of the loop filter, a second input coupled to an output of the ramp generator, and having an output. The system includes a mute loop coupled to an input of the loop filter and the output of the comparator. The system includes a power stage having an input coupled to the output of the comparator, and having an output. The system includes a main loop coupled to the output of the power stage and the input of the loop filter. The system includes an integrated error detector having an input coupled to the loop filter, and having an output. The system includes a dual comparator having an input coupled to the output of the integrated error detector.

20 Claims, 6 Drawing Sheets

REDUCTION OF CLICK AND POP NOISE IN AN AMPLIFIER

BACKGROUND

An amplifier is used to amplify a signal such as an audio signal. However, artifacts may be generated in using the amplifier. For example, a class-D amplifier is an amplifier in which the amplifying devices (e.g., transistors) operate as switches. The amplifying devices operate by rapidly switching back and forth between the supply rails, using pulse-width modulation or related techniques to produce a pulse train output. The pulse train output passes through a low-pass filter that blocks the high-frequency pulses and provides analog output current and voltage. In audio applications the speaker may act as a low pass filter. However, artifacts such as pops and clicks may be audible when using a class-D amplifier.

SUMMARY

In at least one example of the description, a system includes a loop filter including one or more integrators, the loop filter having an input and an output. The system also includes a ramp generator having an output. The system includes a comparator having a first input coupled to the output of the loop filter and a second input coupled to the output of the ramp generator, and having an output. The system also includes a mute loop coupled to the input of the loop filter and the output of the comparator. The system includes a power stage having an input coupled to the output of the comparator, and having an output. The system also includes a main loop coupled to the output of the power stage and the input of the loop filter. The system includes an integrated error detector having an input coupled to the loop filter, and having an output. The system also includes a dual comparator having an input coupled to the output of the integrated error detector, and having an output.

In at least one example of the description, a system includes an amplifier. The amplifier includes a loop filter including one or more integrators, the loop filter having an input and an output. The amplifier includes a ramp generator having an output. The amplifier also includes a comparator having a first input coupled to the output of the loop filter and a second input coupled to the output of the ramp generator, and having an output. The amplifier includes a power stage having an input coupled to the output of the comparator, and having an output. The amplifier also includes a mute loop coupled to the input of the loop filter and the output of the comparator. The amplifier includes a main loop coupled to the output of the power stage and the input of the loop filter. The amplifier also includes an integrated error detector having an input coupled to the loop filter, and having an output. The amplifier includes a dual comparator having an input coupled to the output of the integrated error detector. The amplifier also includes an AND gate having an input coupled to the dual comparator and having an output. The amplifier includes a latch having an input coupled to the output of the AND gate, and having an output.

In at least one example of the description, a system includes a loop filter including one or more integrators, the loop filter having an input and an output. The system also includes a ramp generator having an output, the ramp generator configured to provide a ramp signal. The system includes a comparator having a first input coupled to the output of the loop filter and a second input coupled to the output of the ramp generator, and having an output, the comparator configured to receive the ramp signal from the ramp generator. The system also includes a power stage having an input coupled to the output of the comparator, and having an output. The system includes a mute loop coupled to the input of the loop filter and the output of the comparator, the mute loop configured to provide feedback in a first state of an amplifier. The system also includes a main loop coupled to the output of the power stage and the input of the loop filter, the main loop configured to provide feedback in a second state of the amplifier. The system includes an integrated error detector having an input coupled to the loop filter and having an output, the integrated error detector configured to detect a voltage error in the loop filter. The system also includes a dual comparator having an input coupled to the output of the integrated error detector and having an output, the dual comparator configured to compare the voltage error to a reference voltage.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
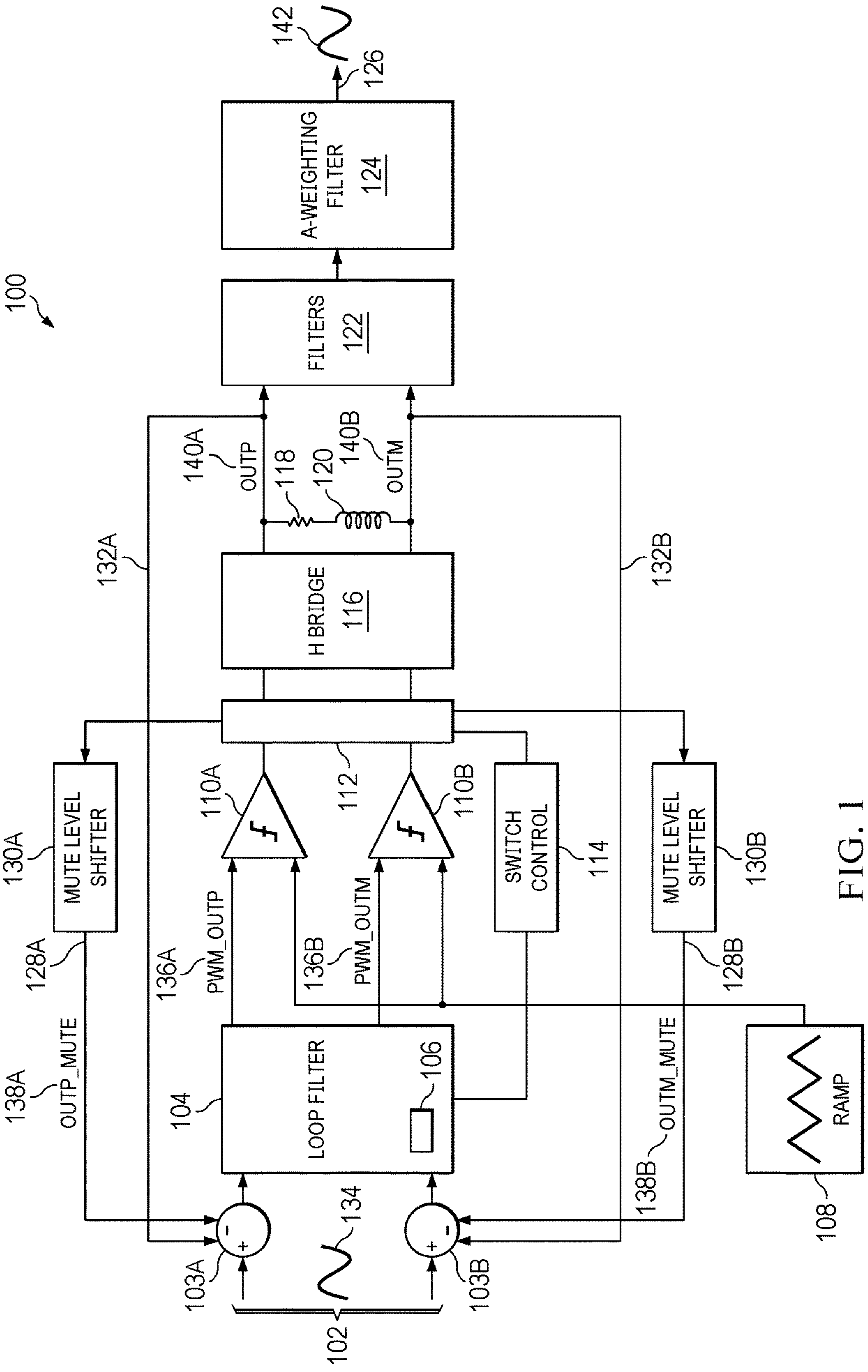
FIG. 1 illustrates circuitry including an example amplifier with reduced click and pop noise.

In an example, class-D amplifiers have high loop gain in the audio band (e.g., 20 Hz to 20 KHz) and a flat closed loop frequency response. Class-D amplifiers receive an input signal that is passed through a high order loop filter. The input signal is compared to a ramp generator signal at a fixed carrier frequency. Pulse width modulation (PWM) creates a stream of pulses at the carrier frequency. The width of each pulse is proportional to the amplitude of the input signal. The PWM signal is then sent to an output stage, also referred to as a power stage, that may include an H-bridge. Finally, the signal is filtered again and provided at an output, for instance to a speaker.

Class-D amplifiers may include two feedback loops. For example, some class-D amplifiers include a main feedback loop and a mute loop (also called a dummy feedback loop). The main feedback loop provides feedback from an output to an input of the class-D amplifier in a first state of operation, for instance "normal" operation. The mute loop provides feedback from a signal path to the input in a second state of operation of the class-D amplifier, such as for power-up or power-down of the amplifier. The power stage of the amplifier operates as a high voltage level shifter that can drive a high voltage and a high current. For example, the power stage increases the power output of the amplifier.

If the main feedback loop is connected and operating in power-up or power-down of the amplifier, this loop may create ringing signals or overshoots at the output of the amplifier due to the PWM pulses being provided to the power stage before the signal settles. Therefore, in some amplifiers, the mute loop is provided. The mute loop is a dummy feedback loop that allows the signals in the amplifier to settle before the PWM pulses are provided to the power stage. A controller and/or switch circuitry may be useful for switching between the main feedback loop and the mute loop. For example, in power-up or power-down of the amplifier, the switch circuitry couples the mute loop to the input and decouples the main loop, so the input signal is not sent all the way through the signal path. Some systems switch to the main feedback loop after the power-up process has run for a certain amount of time. However, high frequency oscillations may always be present in the high order loop filter. These oscillations may create a click or pop noise if the amplifier exits the mute loop when the oscillations are at a high value. Due to randomness in device noise, pops of various sizes could occur in different iterations of the power-up or power-down process.

In examples herein, the state of the signals in the loop filter, called error signals or integrated error signals, is monitored. The system switches from the main feedback loop to the mute loop, or vice versa, responsive to the error signal (e.g., a voltage error) in the loop filter being below or outside of a threshold. Performing the switching between the loops responsive to the error signal being below or outside the threshold leads to reduced click or pop noise as compared to other systems. The error signal may be monitored and detected with any suitable hardware, logic, or circuitry. Examples herein use area and power efficient hardware to sense the error signal. Also, examples herein may provide a deterministic and limited weighted pop value. The pop values are deterministic because the pops occur only if the error signal is below a threshold, and the pop values are limited by the size of the threshold. A user may set the threshold higher or lower to achieve specific performance metrics, such as a maximum pop value.

FIG. 1 illustrates example circuitry 100 that includes or operates as an amplifier that may reduce click and pop noise as compared to some other circuit arrangements. Circuitry 100 is operated as a class-D amplifier that amplifies an input signal to produce an output signal. Circuitry 100 includes a differential input 102, adders 103A and 103B, a loop filter 104 that includes one or more integrators 106, and a ramp generator 108. Circuitry 100 also includes comparators 110A and 110B (singularly, comparator 110 or collectively, comparators 110). Circuitry 100 includes switch circuitry 112 also simply referred to as switch 112, switch control (circuit) 114, and output or power stage 116. Circuitry 100 also includes resistor 118, inductor 120, filters 122 (e.g., an output filter), A-weighting filter 124, and output terminal 126 (which in this case is an output of A-weighting filter 124). In one example, all the elements of circuitry 100 are included on the same integrated circuit (IC) chip. In another example, all the elements of circuitry 100 are included in the same IC package on multiple chips.

In this example arrangement, the circuitry 100 has a signal path from the differential input 102 to the output terminal 126, a main (feedback) loop 132 coupling from the output of power stage 116 to the differential input 102, and a mute or dummy (feedback) loop 128 coupling from the signal path (in this case from outputs of switch 112) to the differential input 102. Thus, the switch 112 in response to control signals from the switch control 114 may be used to switch between the main loop 132 and the mute loop 128. In an example, the switch 112 includes any circuitry suitable for switching between the loops, such as one or more transistor switches.

As shown, mute loop 128 includes loop 128A (e.g., the plus (P) leg of the loop) and loop 128B (e.g., the minus (M) leg of the loop), each coupled between switch 112 and differential input 102. Mute loop 128 includes a mute level shifter 130A on loop 128A and mute level shifter 130B on loop 128B. In an example, the mute level shifters 130A and 130B include circuitry to increase or decrease the value of the feedback signal from the outputs of comparators 110 to an appropriate level for providing feedback to loop filter 104. Mute level shifters 130A and 130B may include any suitable level shifting circuitry, such as a voltage divider, a Schmitt trigger, or a transistor circuit. The main loop 132 includes loop 132A (e.g., the plus (P) leg of the loop) and loop 132B (e.g., the minus (M) leg of the loop). As shown, loops 132A and 132B are represented as direct connections from the outputs of the power stage 116 to the differential input 102. However, loop 132A and/or loop 132B may include any suitable circuitry, for instance, to adjust an input signal at differential input 102 responsive to an output signal from the outputs of the power stage 116 and/or to scale the output signal. FIG. 1 also illustrates a number of signals, such as input signal 134, PWM signals 136A (PWM_OUTP) and 136B (PWM_OUTM), mute loop signals 138A (OUTP_MUTE) and 138B (OUTM_MUTE), power stage output signals OUTP 140A and OUTM 140B, and output signal 142.

Circuitry 100 also includes adders 103A and 103B. Adder 103A has inputs coupled to differential input 102, mute loop 128A, and main loop 132A. Adder 103A has an output coupled to loop filter 104. Adder 103B has inputs coupled to differential input 102, mute loop 128B, and main loop 132B. Adder 103B has an output coupled to loop filter 104. Adders 103A and 103B combine the appropriate feedback signal (from either the main loop 132 or the mute loop 128) with the differential input signal 134.

Loop filter 104 includes an output coupled to switch control 114 and outputs coupled to comparators 110. In an example, loop filter 104 includes one or more integrators 106 to integrate the input signal 134. Loop filter 104 includes outputs that provide PWM signals 136A (PWM_OUTP) and 136B (PWM_OUTM) to comparators 110A and 110B, respectively.

Comparators 110A and 110B each have two inputs and an output. One input of each comparator 110 receives the PWM signal from loop filter 104 (either PWM signal 136A or 136B). The other input of each comparator 110 receives a ramp signal from an output of ramp generator 108. Each comparator 110 produces an output signal at its output, which is provided to switch 112.

Switch 112 receives the output signals from comparators 110 at the inputs of switch 112. Another input of switch 112 is coupled to switch control 114. Switch control 114 is any hardware, logic, or circuitry that controls the operation of switch 112, responsive to a signal detected in the loop filter 104. Switch control 114 includes an output that provides an output signal to switch 112. Switch 112 has outputs coupled to mute loop 128, and outputs coupled to an input of power stage 116. In one state, switch 112 provides output signals to mute loop 128. In another state, switch 112 provides output signals to power stage 116. Switch control 114 controls where the output signal of switch 112 is provided. As illustrated, switch control 114 has an input coupled to an output of the loop filter 104. In an example, switch control 114 detects a signal from the loop filter 104 and controls the switch 112 responsive to the detected signal from the loop filter 104. Further to this example, the switch control 114 provides a control signal to the switch 112. The control signal may include one or more control signals that open and close one or more switches. For example, the control signal includes one or more gate control signals provided to one or more transistors of the switch 112, which are operated as one or more switches.

Power stage 116 is implemented as an H-bridge, in this example. Power stage 116 has inputs that receive the output signals from switch 112. Power stage 116 has outputs coupled to resistor 118 and inductor 120. Power stage 116 produces power stage output signals OUTP 140A and OUTM 140B at its outputs (e.g., a differential signal). Power stage output signals OUTP 140A and OUTM 140B are provided to main loop 132, which couples the output of power stage 116 to differential input 102. Power stage output signals OUTP 140A and OUTM 140B are also provided to filters 122, which provide the output signals to A-weighting filter 124. Filter 122 filters the signals from power stage 116, and may include lowpass filters, bandpass filters, or other suitable filters. A-weighting filter 124 is a filter that approximates the frequency sensitivity of a human ear. A-weighting filter 124 has an output terminal 126 that produces output signal 142.

In an example operation, circuitry 100 uses either the mute loop 128 or the main loop 132. As one example, during a power-up operation, circuitry 100 may begin in the mute loop 128. Powering up using the mute loop 128 prevents noise in circuitry 100 from being passed to the output of the amplifier during the power-up operation. To use the mute loop 128, switch 112 couples the output of comparators 110 to mute loop 128. Mute loop 128 couples the outputs of comparators 110 to differential input 102. Switch control 114 controls the operation of switch 112. With mute loop 128, no signals are provided to power stage 116, so the system is allowed to settle before switching to main loop 132.

After power-up is complete, for example, circuitry 100 switches from mute loop 128 to main loop 132. Switch control 114 controls switch 112 to disengage mute loop 128 and engage main loop 132. To engage main loop 132, switch 112 disconnects from mute loop 128 and couples the outputs of comparators 110 to power stage 116. Thereafter, the signals from the outputs of comparators 110 are provided to power stage 116. Power stage output signals OUTP 140A and OUTM 140B are provided to main loop 132, which couples the output of power stage 116 to differential input 102. Power stage output signals OUTP 140A and OUTM 140B are also provided to filters 122, and output signal 142 is produced.

In some systems, during power-up or power-down, switch 112 switches from mute loop 128 to main loop 132 (or vice versa) after a set amount of time has passed. However, switching at a fixed time may cause the switch to occur at a time when the noise in circuitry 100 is at a high point, thereby causing a pop at the output. In examples herein, switch 112 switches from mute loop 128 to main loop 132 (or vice versa) only if a signal in the loop is below or outside a threshold. The signal is monitored or detected using circuitry in the switch control 114. The switch occurs responsive to the signal being below or within the threshold, for example responsive to an error signal being below or within a threshold. This leads to reduced click and pop noise. In an example described below, an integrated error value is monitored across an integrator 106 within loop filter 104. Switch control 114 detects the integrated error value and provides a signal to switch 112 to switch between the loops at an appropriate time.

Figure 2:
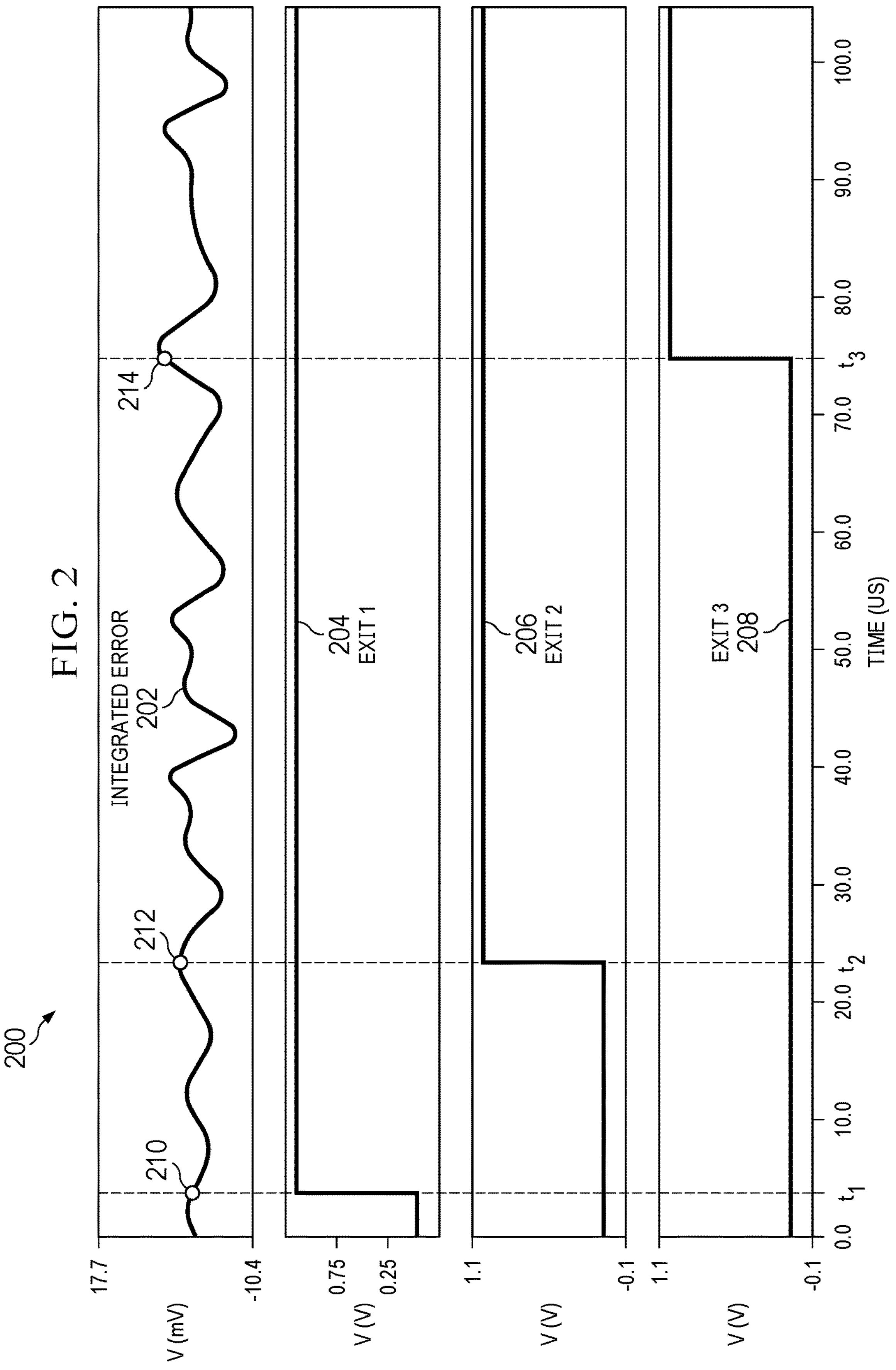
FIG. 2 is graph of waveforms for illustrating how click and pop noise may occur.

FIG. 2 is a graph 200 of waveforms for illustrating how click and pop noise may occur. Graph 200 includes waveforms 202, 204, 206, and 208. Points 210, 212, and 214 are also shown in graph 200.

Waveform 202 is an example of an integrated error signal across an integrator 106. The integrated error signal 202 represents a signal taken from the loop filter 104. In an example, the integrated error signal 202 represents a differential signal taken from the loop filter 104. In a further example, the integrated error signal 202 represents a difference between two components of a differential signal taken from first and second outputs of an integrator 106 of the loop filter 104. For waveform 202, the x-axis is time in microseconds, and the y-axis is voltage in millivolts (mV). Accordingly, each point in time on waveform 202 can be deemed an "integrated error value" which in this example is a voltage value. Waveforms 204, 206, and 208 are examples representing exit points for the mute loop 128. Particularly, waveforms 204, 206, and 208 show three different signals that indicate different points in time for switch 112 to switch between mute loop 128 and main loop 132 responsive to an enable signal being asserted, e.g., going from a logic low value (e.g. 0V) to a logic high value (e.g., 1V). For waveforms 204, 206, and 208, the x-axis is time in microseconds, and the y-axes are voltage in volts (V).

Waveform 204 represents a mute loop exit point responsive to an enable signal asserted at a time $t_1$ at approximately 4 microseconds (e.g., corresponding to point 210 on waveform 202). Waveform 206 shows a mute loop exit point responsive to an enable signal asserted at a time $t_2$ at approximately 22 microseconds (e.g., corresponding to point 212 on waveform 202). Waveform 208 shows a mute loop exit point responsive to an enable signal asserted at a time $t_3$ at approximately 74 microseconds (e.g., corresponding to point 214 on waveform 202). In an example, the value of the integrated error (e.g., the x-axis value of waveform 202) at the time of the exit point corresponds to or correlates to the size of the pop. If the integrated error value is high at the time the switch occurs, a high pop results. If the integrated error value is low at the time the switch occurs, a low pop results. In examples herein, the value of the integrated error is monitored, and the switch occurs only if the integrated error is below or within a threshold.

Figure 3:
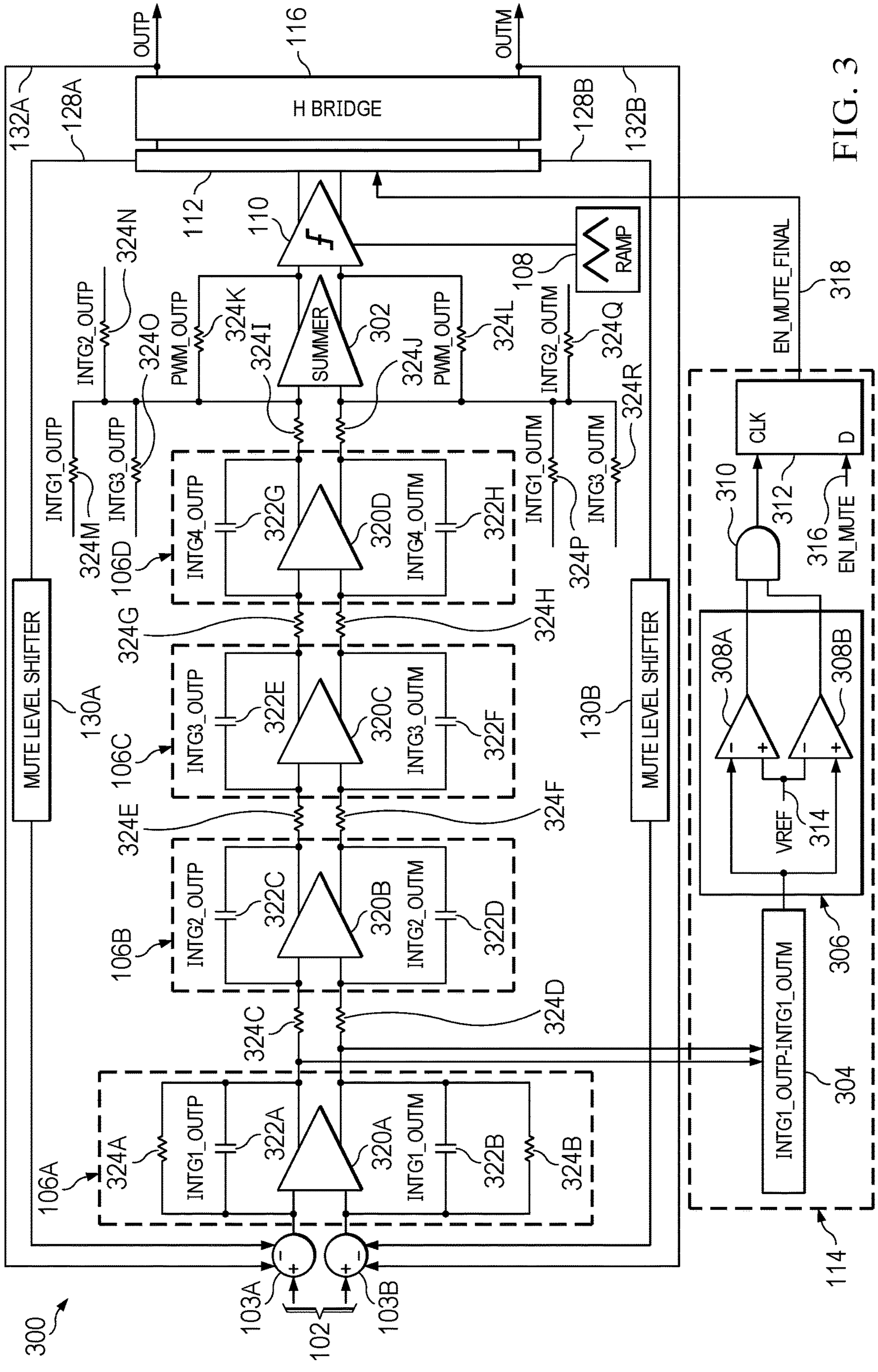
FIG. 3 illustrates circuitry including an example amplifier with reduced click and pop noise.

FIG. 3 illustrates circuitry including an example amplifier with reduced click and pop noise. Circuitry 300 represents a portion of a class-D amplifier that amplifies an input signal to produce an output signal. Some of the components in circuitry 300 are described above with respect to circuitry 100, and like numerals denote like components. Some components in circuitry 100 are not shown in circuitry 300, but the operation of circuitry 100 and circuitry 300 is similar in some examples.

Circuitry 300 includes differential input 102, integrators 106 (e.g., 106A, 106B, 106C, and 106D), ramp generator 108, comparator 110, switch 112, switch control 114, and power stage 116. Circuitry 300 also includes mute loop 128 (e.g., loops 128A and 128B), mute level shifters 130A and 130B, and main loop 132 (e.g., loops 132A and 132B). Circuitry 300 also includes summer 302. Switch control 114 includes integrated error detector 304 and dual comparator 306, which includes comparators 308A and 308B. Switch control 114 includes AND gate 310 and latch 312, which can be implemented using other logic circuitry that performs the relevant function. FIG. 1 also illustrates a number of signals including reference voltage ($V_{REF}$) 314, EN_MUTE signal 316, and EN_MUTE_FINAL signal 318.

Circuitry 300 includes four integrators 106 in this example. Each integrator 106 includes an amplifier 320 and capacitors 322. Circuitry 300 also includes a number of resistors 324A-324R. Each of the integrators 106 produces an output voltage that is an integration of its input voltage over time. The output signals of the integrators 106 are summed or combined at summer 302 to provide a final loop filter output signal to comparator 110.

In circuitry 300, integrator 106A has two inputs coupled to the outputs of adders 103A and 103B. Integrator 106A has two outputs coupled to resistors 324C and 324D. The outputs of integrator 106A are also coupled to integrated error detector 304. Integrator 106A includes an amplifier 320A that has two inputs coupled to the outputs of adders 103. Amplifier 320A has two outputs that are coupled to resistors 324C and 324D, respectively. Integrator 106A has two capacitors 322A and 322B, each coupled between the input and the output of amplifier 320A. An INTG1_OUTP signal is created across capacitor 322A, and an INTG1_OUTM signal is created across capacitor 322B. Resistor 324A is coupled across capacitor 322A, and resistor 324B is coupled across capacitor 322B.

Integrator 106B has two inputs coupled to resistors 324C and 324D, respectively. Integrator 106B has two outputs coupled to resistors 324E and 324F. Integrator 106B includes an amplifier 320B that has two inputs coupled to resistors 324C and 324D. Amplifier 320B has two outputs that are coupled to resistors 324E and 324F, respectively. Integrator 106B has two capacitors 322C and 322D, each coupled between the input and the output of amplifier 320B. An INTG2_OUTP signal is created across capacitor 322C, and an INTG2_OUTM signal is created across capacitor 322D.

Integrator 106C has two inputs coupled to resistors 324E and 324F, respectively. Integrator 106C has two outputs coupled to resistors 324G and 324H. Integrator 106C includes an amplifier 320C that has two inputs coupled to resistors 324E and 324F. Amplifier 320C has two outputs that are coupled to resistors 324G and 324H, respectively. Integrator 106C has two capacitors 322E and 322F, each coupled between the input and the output of amplifier 320C. An INTG3_OUTP signal is created across capacitor 322E, and an INTG3_OUTM signal is created across capacitor 322F.

Integrator 106D has two inputs coupled to resistors 324G and 324H, respectively. Integrator 106D has two outputs coupled to resistors 324I and 324J. Integrator 106D includes an amplifier 320D that has two inputs coupled to resistors 324G and 324H. Amplifier 320D has two outputs that are coupled to resistors 324I and 324J, respectively. Integrator 106D has two capacitors 322G and 322H, each coupled between the input and the output of amplifier 320D. An INTG4_OUTP signal is created across capacitor 322G, and an INTG4_OUTM signal is created across capacitor 322H.

Summer 302 has two inputs coupled to resistors 324I and 324J, respectively. A first input of summer 302 receives the three signals INTG1_OUTP, INTG2_OUTP, and INTG3_OUTP from resistors 324M, 324N, and 3240, respectively. The first input of summer 302 also receives the INTG4_OUTP signal from integrator 106D. A second input of summer 302 receives the three signals INTG1_OUTM, INTG2_OUTM, and INTG3_OUTM from resistors 324P, 324Q, and 324R, respectively. The second input of summer 302 also receives the INTG4_OUTM signal from integrator 106D. Summer 302 has two outputs that are coupled to the inputs of comparator 110. Resistor 324K is coupled from a first output of summer 302 to a first input of summer 302. Resistor 324L is coupled from a second output of summer 302 to a second input of summer 302. Comparator 110 receives the ramp signal from ramp generator 108 and provides an output signal to switch 112. As described above, switch 112 switches between mute loop 128 and main loop 132. Switch 112 has outputs coupled to mute level shifters 130A, 130B, and to power stage 116.

In switch control 114, integrated error detector 304 has two inputs coupled to the two outputs of integrator 106A. Integrated error detector 304 has an output coupled to comparator 306. Comparator 306 is a dual comparator that includes two internal comparators 308A and 308B. The output of integrated error detector 304 is coupled to the first input of comparator 308A and the second input of comparator 308B. The second input of comparator 308A and the first input of comparator 308B is coupled to a reference voltage $V_{REF}$ 314 from any suitable voltage source.

The outputs of comparators 308A and 308B are coupled to the inputs of AND gate 310. AND gate 310 has an output coupled to the CLK input of latch 312. Latch 312 has a D input that receives an EN_MUTE signal 316. Latch 312 provides an output signal EN_MUTE_FINAL signal 318 at the latch output.

In an example, integrated error detector 304 monitors or detects the integrated error signal across integrator 106A. In other examples, the integrated error signal may be monitored at another location in circuitry 300, such as across one or more other integrator outputs. Integrated error detector 304 may include any hardware, logic, or circuitry to determine the integrated error. The integrated error may be determined by subtracting the value INTG_OUTM from INTG_OUTP, which are the output signals of the integrator 106A. Integrated error detector 304 produces the integrated error value and provides this value to the input of comparator 306. An example of integrated error values is represented as waveform 402 in FIG. 4, described below.

Comparator 306 compares the integrated error value provided by integrated error detector 304 to the threshold. Because the integrator 106 integrates a differential input signal that could be positive or negative, comparator 306 determines if the integrated error is within a specific range, such as greater than −2 mV but less than +2 mV. An integrated error that is too low (e.g., below −2 mV) or too high (e.g., above +2 mV) may cause a pop noise when entering or exiting the mute loop 128. The range (determined by the threshold) may be set by a user to any suitable value. The threshold is provided by $V_{REF}$ 314. In this example, $V_{REF}$ 314 may be 2 mV, which sets a range of −2 mV to +2 mV.

The integrated error is provided to a negative input of comparator 308A. $V_{REF}$ 314 is provided to a positive input of comparator 308A. The integrated error is provided to a positive input of comparator 308B. $V_{REF}$ 314 is provided to a negative input of comparator 308B. Therefore, comparator 308A determines if the integrated error is less than +2 mV. If so, comparator 308A provides a 1 at its output. Comparator 308B determines if the integrated error is greater than −2 mV. If so, comparator 308B provides a 1 at its output. If both comparator 308A and comparator 308B provide a 1 output, then the integrated error is between −2 mV and +2 mV, and the amplifier can exit the mute loop. If either comparator 308A or comparator 308B provides a 0 output, then the integrated error is too high (in either the positive or negative direction) and the amplifier remains in the mute loop until the integrated error falls below the threshold.

The outputs of comparators 308A and 308B are coupled to the inputs of AND gate 310. AND gate 310 determines if both comparators produced a 1 output. If so, AND gate 310 produces a 1 output. If not, AND gate 310 produces a 0 output. The amplifier can only exit the mute loop 128 if AND gate 310 produces a 1 output. If the integrated error is below the threshold, AND gate 310 provides a 1 output to the clock input of latch 312. If latch 312 receives a positive EN_MUTE signal 316 at the D input while the AND output is 1, latch 312 produces the EN_MUTE_FINAL signal 318 at the latch output. The EN_MUTE_FINAL signal 318 indicates to switch 112 that the loop can be switched from the mute loop to the main loop, or vice versa. The EN_MUTE_FINAL signal 318 is provided only if the AND gate output is 1 (e.g., the integrated error is below the threshold), and the EN_MUTE signal 316 from a digital controller indicates that the system is ready to switch the loop (e.g., during power-up or power-down). The interaction of these signals is described with respect to FIG. 4 below. If the EN_MUTE signal 316 is received but the integrated error is above the threshold, latch 312 does not produce the EN_MUTE_FINAL signal 318. If the integrated error is below the threshold but the EN_MUTE signal 316 has not been received by latch 312, latch 312 does not produce the EN_MUTE_FINAL signal 318. If both input conditions for latch 312 are met, the amplifier can switch from one loop to another.

Switch control 114 provides one example of digital logic for detecting the integrated error and determining if and when to switch the loop. Other examples may use different digital logic but perform the functions described herein.

Figure 4:
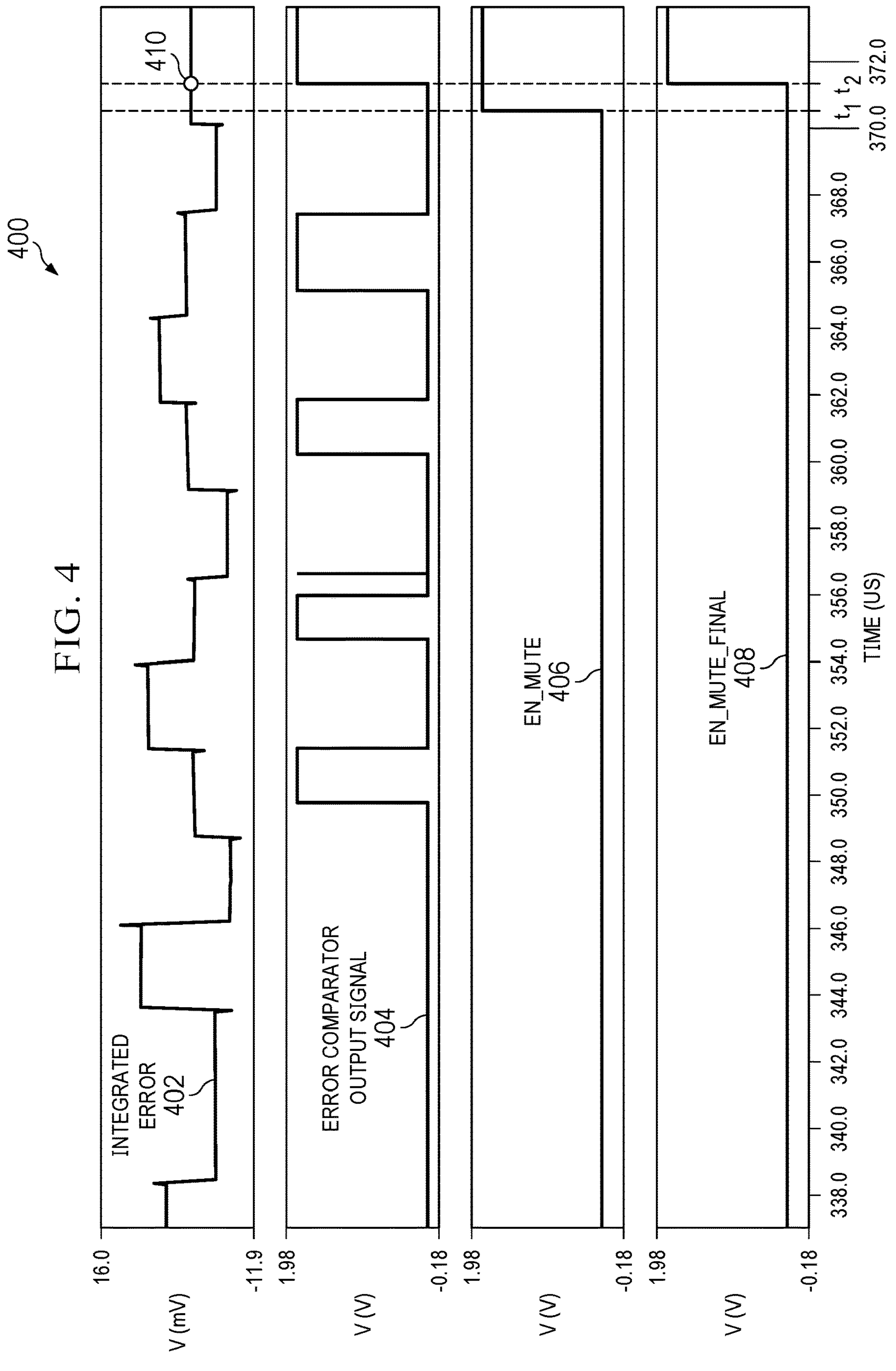
FIG. 4 is graph of waveforms for illustrating how click and pop noise may be reduced using the circuit arrangements of FIGS. 1 and 3.

FIG. 4 is a graph 400 of waveforms illustrating how click and pop noise may be reduced using the circuit arrangements of FIGS. 1 and 3. Graph 400 includes waveforms 402, 404, 406, and 408. Point 410 is also shown in graph 400.

Waveform 402 is an example representation of an integrated error value across an integrator 106, such as determined by integrated error detector 304. For waveform 402, the x-axis is time in microseconds, and the y-axis is voltage in mV. Waveform 404 represents the error comparator output signal (e.g., the output signal of AND gate 310). For waveform 404, the x-axis is time in microseconds, and the y-axis is voltage in volts (V). Waveform 406 is the EN_MUTE signal 316, which a digital controller may provide in one example. For waveform 406, the x-axis is time in microseconds, and the y-axis is voltage in volts (V). Waveform 408 is the EN_MUTE_FINAL signal 318, which is produced by the output of latch 312. For waveform 408, the x-axis is time in microseconds, and the y-axis is voltage in volts (V).

Graph 400 shows one example of monitoring an integrated error in the amplifier, and exiting the mute loop 128 if the integrated error is below a threshold (e.g., a threshold set by $V_{REF}$ 314). Waveform 402 shows the value of the integrated error provided by integrated error detector 304. As one example, the threshold may be plus or minus 2 mV. If the integrated error is more than −2 mV and less than 2 mV, the mute loop 128 may be exited. If the integrated error is below −2 mV, the amplifier remains in the mute loop 128. If the integrated error is above 2 mV, the amplifier remains in the mute loop 128. The integrated error detector 304 continually monitors the integrated error. If the integrated error is more than −2 mV and less than 2 mV in this example, the error comparator output goes high (e.g., waveform 404). As shown in graph 400, waveform 404 switches between a high and low value depending on the value of the integrated error in waveform 402.

Graph 400 shows that the amplifier exits the mute loop only if both the error comparator output is high (waveform 404), and the EN_MUTE signal 316 is high (waveform 406). In this example, waveform 406 is low until time $t_1$. At time $t_1$, waveform 406 goes high. This signal indicates that a digital controller, processor, or other component has indicated to switch from the mute loop 128 to the main loop 132. The EN_MUTE signal 316 could go high after a power-up process is complete, for example.

After the EN_MUTE signal 316 (waveform 406) goes high, the amplifier may exit the mute loop 128. However, as described herein, the amplifier does not exit the mute loop 128 until the integrated error is below the threshold. By waiting until the integrated error is below the threshold, click and pop noise is reduced. Here, at time $t_1$, the integrated error is still above the threshold, as indicated by waveform 404 being low at time $t_1$. At time $t_2$ (point 410 on waveform 402), the value of the integrated error (waveform 402) has fallen below the threshold. Therefore, at time $t_2$, waveform 404 goes high. Because both waveform 404 and 406 are high at time $t_2$, the amplifier may exit the mute loop 128 at time $t_2$. Latch 312 produces the EN_MUTE_FINAL signal 318 at time $t_2$, which is indicated by waveform 408 going high. The EN_MUTE_FINAL signal 318 is provided to switch 112 as shown in FIG. 3, and switch 112 switches from the mute loop 128 to the main loop 132 responsive to the EN_MUTE_FINAL signal 318.

Figure 5:
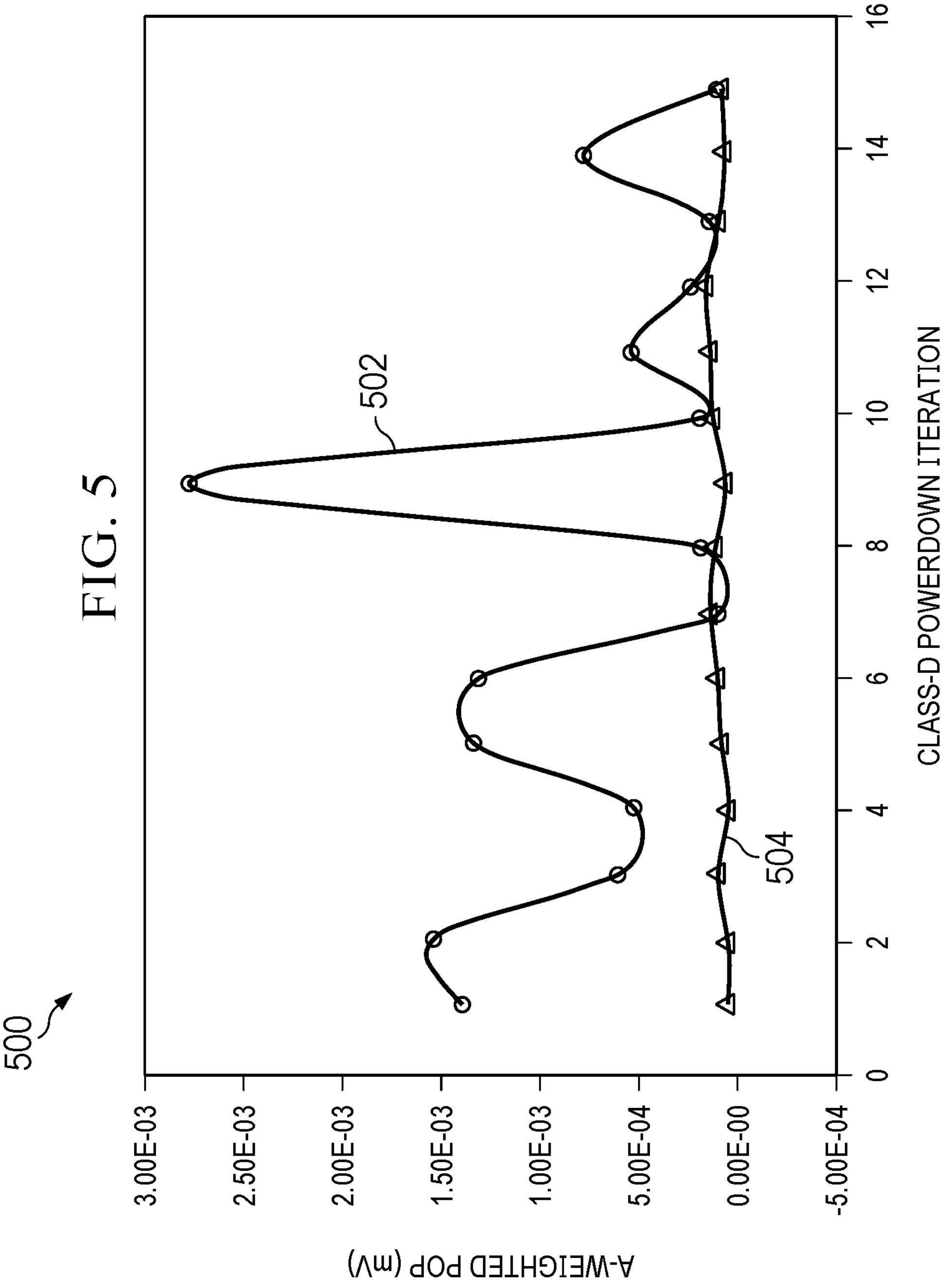
FIG. 5 is an example graph of A-weighted pop values.

FIG. 5 is an example graph 500 of A-weighted pop values. FIG. 5 shows two waveforms 502 and 504. In graph 500, the x-axis is the iteration number, and the y-axis is the A-weighted pop value in mV.

In graph 500, waveform 502 shows the pop values for a system that does not monitor the integrated error before entering or exiting the mute loop 128. Rather, this system exits or enters the mute loop after a set amount of time has passed. Fifteen iterations are shown on the x-axis. In those iterations, the pop values vary in size, and may be as high as 2.5e-3 mV in some examples.

Waveform 504 shows the pop values for a system with an integrated error detector 304 as described herein. In waveform 504, the integrated error in the amplifier is monitored and the mute loop 128 is entered or exited only if the error is below a threshold. Therefore, the pop values may be low and deterministic. Waveform 504 shows that the pop values are each below 2.0e-4 for these fifteen iterations. Therefore, pop noise is significantly reduced in examples herein.

Figure 6:
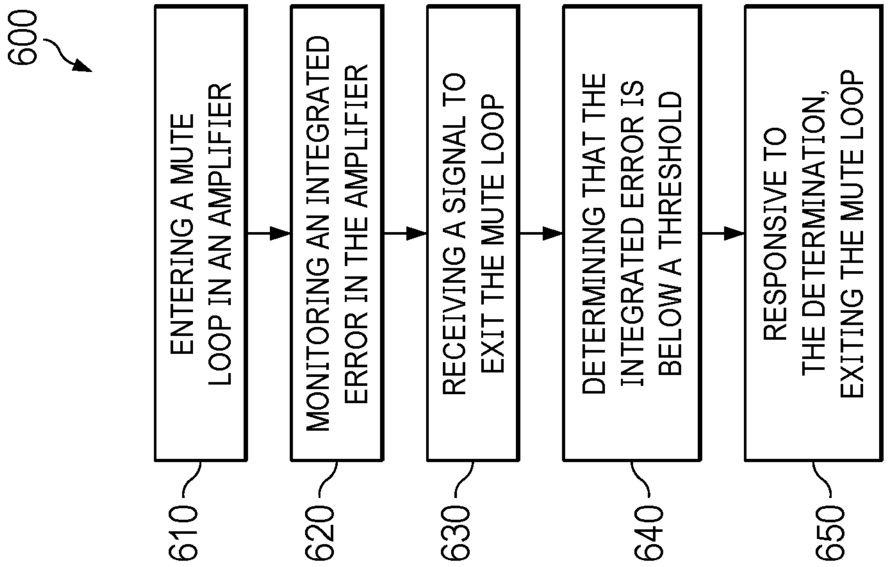
FIG. 6 is a flow diagram of an example method for switching between a mute loop and a main loop in an amplifier.

FIG. 6 is a flow diagram of an example method 600 for switching between a mute loop and a main loop in an amplifier. The steps of method 600 may be performed in any suitable order. The hardware components described above with respect to FIGS. 1 and 3 may perform method 600 in some examples. Any suitable hardware, software, or digital logic may perform method 600 in some examples.

Method 600 begins at 610, where an amplifier enters a mute loop, such as mute loop 128. The amplifier may be a class-D amplifier in one example. The amplifier may enter the mute loop 128 for a power-up or power-down operation. In other examples, the amplifier may enter the mute loop 128 to noise gate the amplifier. In an audio device, if the device is not producing any audio (e.g., during a silent portion of an audio track), the amplifier may be noise gated to shut down temporarily and save power.

Method 600 continues at 620, where an integrated error detector 304 monitors the error in the amplifier. As described above, the error may be monitored across an integrator 106 in a loop filter 104 in one example. Any suitable method, hardware, logic, or circuitry may be useful for monitoring the integrated error.

Method 600 continues at 630, where the amplifier receives a signal to exit the mute loop 128. The signal may come from a controller or processor in one example. The amplifier may receive a signal to exit the mute loop 128 to begin a power-up operation in one example. In another example, the amplifier may receive a signal to exit the mute loop 128 because noise gating is no longer needed.

Method 600 continues at 640, where circuitry (such as switch control 114) determines that the integrated error is below a threshold. The amplifier remains in the mute loop 128 until the integrated error is below the threshold, to reduce the pop noise. The threshold may be set by a user to meet certain performance metrics or specifications related to pop noise. Any suitable logic, hardware, or circuitry may be useful for determining if the integrated error is below the threshold.

Method 600 continues at 650, where responsive to the determination that the integrated error is below the threshold, the amplifier exits the mute loop 128. If the integrated error is above the threshold, the integrated error detector 304 continues monitoring the integrated error until it is safe to exit the mute loop 128. After the integrated error falls below the threshold, a signal may be sent to switch 112 from switch control 114 to switch from the mute loop 128 to the main loop 132. The amplifier then exits the mute loop 128 and uses the main loop 132 for operation.

In some examples, there is additional power-up or power-down time as the loop has to settle before entering or exiting the mute loop. However, this time is small for an amplifier such as a 384 kilohertz (kHz) class-D amplifier with a 1 mV $V_{REF}$ signal. The additional power-up or power-down time may increase by 10% in one example, but the pop reduction may be 10× or greater compared to other systems. The additional time for power-up or power-down may be reduced by switching to a higher ramp frequency from ramp generator 108 during power-up or power-down. Increasing the ramp frequency allows the loop to settle faster which may reduce the additional overhead time to a value less than 10% in some examples.

In examples herein, the state of the signals in the loop filter is monitored if the system is switching from the main feedback loop to the mute loop, or vice versa. The mute loop may be useful during an off state of the amplifier (such as noise gating), while the main loop is useful during an on state of the amplifier (e.g., normal operation). The system switches from one loop to the other only if the value of the integrated error signal in the loop filter is below a threshold. If the error signal is below the threshold, the click or pop noise occurring during the loop switchover is reduced compared to other systems. The integrated error signal may be monitored and detected with any suitable hardware, logic, or circuitry. The examples described herein are also area and power efficient, as existing hardware may be used to sense the error signal, with the addition of a small amount of digital logic. The examples herein provide a deterministic and limited weighted pop value.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A system, comprising:

a loop filter including one or more integrators, the loop filter having an input and an output;

a ramp generator having an output;

a comparator having a first input coupled to the output of the loop filter and a second input coupled to the output of the ramp generator, and having an output;

a mute loop coupled to the input of the loop filter and the output of the comparator;

a power stage having an input coupled to the output of the comparator, and having an output;

a main loop coupled to the output of the power stage and the input of the loop filter;

an integrated error detector having an input coupled to the loop filter, and having an output; and a dual comparator having an input coupled to the output of the integrated error detector, and having an output.

2. The system of claim 1, wherein the system comprises a class-D amplifier.

3. The system of claim 1, further comprising a differential input coupled to the input of the loop filter.

4. The system of claim 1, wherein the power stage includes an H-bridge.

5. The system of claim 1, further comprising:

an output filter having an input coupled to the output of the power stage, and having an output.

6. The system of claim 1, further comprising:

a switch coupled to the mute loop.

7. The system of claim 6, wherein the switch is also coupled to the comparator and to the power stage.

8. A system, comprising:

an amplifier including:

a loop filter including one or more integrators, the loop filter having an input and an output;

a ramp generator having an output;

a comparator having a first input coupled to the output of the loop filter and a second input coupled to the output of the ramp generator, and having an output;

a power stage having an input coupled to the output of the comparator, and having an output;

a mute loop coupled to the input of the loop filter and the output of the comparator;

a main loop coupled to the output of the power stage and the input of the loop filter;

an integrated error detector having an input coupled to the loop filter, and having an output;

a dual comparator having an input coupled to the output of the integrated error detector;

an AND gate having an input coupled to the dual comparator and having an output; and a latch having an input coupled to the output of the AND gate, and having an output.

9. The system of claim 8, wherein the amplifier is a class-D amplifier.

10. The system of claim 8, wherein the power stage includes an H-bridge.

11. The system of claim 8, wherein the output of the latch is coupled to a switch.

12. The system of claim 11, wherein the switch is coupled to the mute loop and the main loop.

13. The system of claim 12, wherein the switch is also coupled to the comparator and the power stage.

14. A system, comprising:

a loop filter including one or more integrators, the loop filter having an input and an output;

a ramp generator having an output, the ramp generator configured to provide a ramp signal;

a comparator having a first input coupled to the output of the loop filter and a second input coupled to the output of the ramp generator, and having an output, the comparator configured to receive the ramp signal from the ramp generator;

a power stage having an input coupled to the output of the comparator, and having an output;

a mute loop coupled to the input of the loop filter and the output of the comparator, the mute loop configured to provide feedback in a first state of an amplifier;

a main loop coupled to the output of the power stage and the input of the loop filter, the main loop configured to provide feedback in a second state of the amplifier;

an integrated error detector having an input coupled to the loop filter and having an output, the integrated error detector configured to detect a voltage error in the loop filter; and a dual comparator having an input coupled to the output of the integrated error detector and having an output, the dual comparator configured to compare the voltage error to a reference voltage.

15. The system of claim 14, wherein the ramp generator is configured to switch to a higher ramp frequency in the first state of the amplifier.

16. The system of claim 14, further comprising:

an AND gate having an input coupled to the output of the dual comparator, and having an output; and a latch having an input coupled to the output of the AND gate.

17. The system of claim 16, wherein the latch is configured to provide a signal to switch between the mute loop and the main loop.

18. The system of claim 14, wherein the first state is an off state of the amplifier, and the second state is an on state of the amplifier.

19. The system of claim 14, wherein the dual comparator is configured to indicate that the voltage error is lower than the reference voltage.

20. The system of claim 14, wherein the integrated error detector detects the voltage error across an integrator in the loop filter.

* * * * *